(12) United States Patent
Lee et al.

(10) Patent No.: US 10,804,299 B2
(45) Date of Patent: Oct. 13, 2020

(54) THIN FILM TRANSISTOR, MANUFACTURING METHOD THEREOF, AND DISPLAY DEVICE HAVING THE SAME

(71) Applicant: SAMSUNG DISPLAY CO., LTD., Yongin-si, Gyeonggi-Do (KR)

(72) Inventors: Jun Hee Lee, Yongin-si (KR); In Jun Bae, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/275,829

(22) Filed: Feb. 14, 2019

(65) Prior Publication Data

US 2019/0189647 A1    Jun. 20, 2019

Related U.S. Application Data

(62) Division of application No. 15/635,479, filed on Jun. 28, 2017, now Pat. No. 10,236,308.

(30) Foreign Application Priority Data

Nov. 4, 2016 (KR) ........................ 10-2016-0147004

(51) Int. Cl.
   *H01L 27/12* (2006.01)
   *H01L 29/786* (2006.01)
   *H01L 27/32* (2006.01)

(52) U.S. Cl.
   CPC ...... *H01L 27/1248* (2013.01); *H01L 27/1262* (2013.01); *H01L 29/78618* (2013.01); *H01L 29/78633* (2013.01); *H01L 29/78696* (2013.01); *H01L 27/1222* (2013.01); *H01L 27/3262* (2013.01); *H01L 27/3272* (2013.01)

(58) Field of Classification Search
   CPC ............ H01L 27/1248; H01L 27/3272; H01L 27/3262; H01L 27/1222; H01L 29/78696; H01L 29/78633; H01L 29/78618
   See application file for complete search history.

(56) References Cited

U.S. PATENT DOCUMENTS

| | | | |
|---|---|---|---|
| 2011/0013106 A1* | 1/2011 | Liu | .................... G02F 1/136286 |
| | | | 349/46 |
| 2012/0305930 A1 | 12/2012 | Makita et al. | |
| 2016/0093647 A1* | 3/2016 | Kim | .................... H01L 27/3248 |
| | | | 349/46 |

(Continued)

*Primary Examiner* — Kyoung Lee
*Assistant Examiner* — Christina A Sylvia
(74) *Attorney, Agent, or Firm* — F. Chau & Associates, LLC

(57) ABSTRACT

A thin film transistor includes a first blocking layer disposed on a substrate, and an active pattern disposed on the first blocking layer. The active pattern includes a source region, a drain region, and a channel region disposed between the source region and the drain region. The thin film transistor further includes a gate electrode disposed on the active pattern. The channel region corresponds to a portion of the active pattern overlapped by the gate electrode. The thin film transistor additionally includes a source electrode connected to the source region, and a drain electrode connected to the drain region. The active pattern includes a first part and a second part. The first part partially overlaps with the first blocking layer, and the first part and the second part have different thicknesses from each other.

16 Claims, 9 Drawing Sheets

(56) References Cited

U.S. PATENT DOCUMENTS

| | | |
|---|---|---|
| 2017/0025439 A1 | 1/2017 | I et al. |
| 2018/0114823 A1* | 4/2018 | Lee ................... H01L 27/3272 |
| 2018/0130827 A1* | 5/2018 | Lee ................... H01L 27/1262 |
| 2019/0155119 A1* | 5/2019 | Matsukizono .... G02F 1/136286 |

* cited by examiner

THIN FILM TRANSISTOR, MANUFACTURING METHOD THEREOF, AND DISPLAY DEVICE HAVING THE SAME

CROSS-REFERENCE TO RELATED APPLICATIONS

The present application is a divisional application of U.S. patent application Ser. No. 15/635,479 filed Jun. 28, 2017, which claims priority under 35 U.S.C. § 119 to Korean Patent Application No. 10-2016-0147004, filed on Nov. 4, 2016, in the Korean Intellectual Propel Office, the disclosures of which are incorporated by reference herein in their entireties.

TECHNICAL FIELD

Exemplary embodiments of the present invention relate to a thin film transistor, a manufacturing method thereof, and a display device having the same.

DISCUSSION OF THE RELATED ART

Thin film transistors may be used as switching devices in display devices such as liquid crystal display devices and organic light-emitting display devices. A transfer of current or a leakage of current in thin film transistors may depend on the material and status of a channel layer along which charge carriers move.

When a thin film transistor is included in a transparent display device in which light is irradiated onto the back surface of a display panel, characteristics of the channel layer may be changed by the light irradiated onto the back surface of the display panel. Therefore, as the luminance of the display panel increases, a leakage current may be generated as the level of an off current of the thin film transistor increases.

SUMMARY

According to an exemplary embodiment of the present invention, a thin film transistor includes a first blocking layer disposed on a substrate, and an active pattern disposed on the first blocking layer. The active pattern includes a source region, a drain region, and a channel region disposed between the source region and the drain region. The thin film transistor further includes a gate electrode disposed on the active pattern. The channel region corresponds to a portion of the active pattern overlapped by the gate electrode. The thin film transistor additionally includes a source electrode connected to the source region, and a drain electrode connected to the drain region. The active pattern includes a first part and a second part. The first part partially overlaps with the first blocking layer, and the first part and the second part have different thicknesses from each other.

In an exemplary embodiment of the present invention, the second part of the active pattern does not overlap with the first blocking layer.

In an exemplary embodiment of the present invention, a thickness of the first part of the active pattern is less than a thickness of the second part of the active pattern.

In an exemplary embodiment of the present invention, the drain region partially overlaps with the first blocking layer.

In an exemplary embodiment of the present invention, the active pattern further includes a drain-channel contact part disposed between the drain region and the channel region. The drain-channel contact part overlaps with the first blocking layer.

In an exemplary embodiment of the present invention, the drain-channel contact part is covered by the first blocking layer to block light that is incident onto a surface of the substrate, on which the active pattern is not disposed.

In an exemplary embodiment of the present invention, the drain-channel contact part partially extends into the channel region from a point at which the channel region and the drain region are in contact with each other.

In an exemplary embodiment of the present invention, the drain-channel contact part has a width of about 3.5 µm or more.

In an exemplary embodiment of the present invention, a thin film transistor further includes a second blocking layer partially overlapping with the drain region and the channel region. The first blocking layer partially overlaps with the source region and the channel region.

In an exemplary embodiment of the present invention, the first blocking layer and the second blocking layer are disposed in the same layer.

In an exemplary embodiment of the present invention, the active pattern further includes a source-channel contact part disposed between the source region and the channel region, and a drain-channel contact part disposed between the drain region and the channel region. The source-channel contact part overlaps with the first blocking layer, and the drain-channel contact part overlaps with the second blocking layer.

In an exemplary embodiment of the present invention, the source-channel contact part is covered by the first blocking layer to block light that is incident onto a surface of the substrate, on which the active pattern is not disposed, and the drain-channel contact part is covered by the second blocking layer to block light that is incident onto the first surface of the substrate.

In an exemplary embodiment of the present invention, the source-channel contact part partially extends into the channel region from a point at which the channel region and the source region are in contact with each other, and the drain-channel contact part partially extends into the channel region from a point at which the channel region and the drain region are in contact with each other.

In an exemplary embodiment of the present invention, each of the source-channel contact part and the drain-channel contact part has a width of about 3.5 µm or more.

In an exemplary embodiment of the present invention, the first blocking layer overlaps with the channel region, the source region, and the drain region.

In an exemplary embodiment of the present invention, the first blocking layer includes a metal.

According to an exemplary embodiment of the present invention, a method of manufacturing a thin film transistor, the method includes forming a blocking layer on a substrate, forming a buffer layer over the blocking layer, and forming a semiconductor layer on the buffer layer, the semiconductor layer including a first part and a second part. The first part and the second part have different thicknesses from each other. The method further includes forming a gate insulating layer over the semiconductor layer, forming a gate electrode covering a region of the semiconductor layer on the gate insulating layer, and forming an active pattern by doping impurities on the substrate on which the gate electrode is formed. The active pattern includes a source region, a drain region, and a channel region disposed between the source region and the drain region. The method additionally includes forming a source electrode connected to the source region, and forming a drain electrode connected to the drain region.

In an exemplary embodiment of the present invention, the forming of the semiconductor layer includes coating the buffer layer with a semiconductor material layer, and performing a planarization process on the semiconductor material layer.

In an exemplary embodiment of the present invention, the first part of the semiconductor layer overlaps with the blocking layer, and the second part of the semiconductor layer does not overlap with the blocking layer.

In an exemplary embodiment of the present invention, a thickness of the first part of the semiconductor layer is less than a thickness of the second part of the semiconductor layer.

According to an exemplary embodiment of the present invention, a display device includes a display element, and a thin film transistor connected to the display element. The thin film transistor includes a first blocking layer disposed on a substrate, and an active pattern disposed on the first blocking layer. The active pattern includes a source region, a drain region, and a channel region disposed between the source region and the drain region. The display device further includes a gate electrode disposed on the active pattern. The channel region corresponds to a portion of the active pattern overlapping by the gate electrode. The display device additionally includes a source electrode connected to the source region, and a drain electrode connected to the drain region. The active pattern includes a first part and a second part. The first part partially overlaps with the first blocking layer, and the first part and the second part have different thicknesses from each other.

In an exemplary embodiment of the present invention, the second part of the active pattern does not overlap with the first blocking layer.

In an exemplary embodiment of the present invention, the drain region partially overlaps with the first blocking layer.

In an exemplary embodiment of the present invention, the active pattern further includes a drain-channel contact part disposed between the drain region and the channel region. The drain-channel contact part overlaps with the first blocking layer.

In an exemplary embodiment of the present invention, the drain-channel contact part is covered by the first blocking layer to block light that is incident onto a surface of the substrate, on which the active pattern is not disposed.

In an exemplary embodiment of the present invention, the drain-channel contact part partially extends into the channel region from a point at which the channel region and the drain region are in contact with each other.

In an exemplary embodiment of the present invention, the drain-channel contact part has a width of about 3.5 μm or more.

In an exemplary embodiment of the present invention, the display device further includes a second blocking layer partially overlapping with the drain region and the channel region. The first blocking layer partially overlaps with the source region and the channel region.

In an exemplary embodiment of the present invention, the first blocking layer and the second blocking layer are disposed in the same layer.

In an exemplary embodiment of the present invention, the active pattern further includes a source-channel contact part disposed between the source region and the channel region, and a drain-channel contact part disposed between the drain region and the channel region. The source-channel contact part overlaps with the first blocking layer, and the drain-channel contact part overlaps with the second blocking layer.

In an exemplary embodiment of the present invention, the source-channel contact part is covered by the first blocking layer to block light that is incident onto a surface of the substrate, on which the active pattern is not disposed, and the drain-channel contact part is covered by the second blocking layer to block light that is incident onto the surface of the substrate, on which the active pattern is not disposed.

In an exemplary embodiment of the present invention, the source-channel contact part partially extends into the channel region from a point at which the channel region and the source region are in contact with each other, and the drain-channel contact part partially extends into the channel region from a point at which the channel region and the drain region are in contact with each other.

In an exemplary embodiment of the present invention, each of the source-channel contact part and the drain-channel contact part has a width of about 3.5 μm or more.

In an exemplary embodiment of the present invention, the first blocking layer overlaps with the channel region, the source region, and the drain region.

In an exemplary embodiment of the present invention, the display element includes a first electrode connected to the drain electrode of the thin film transistor, an emitting layer disposed on the first electrode, and a second electrode disposed on the emitting layer.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Figure 1:
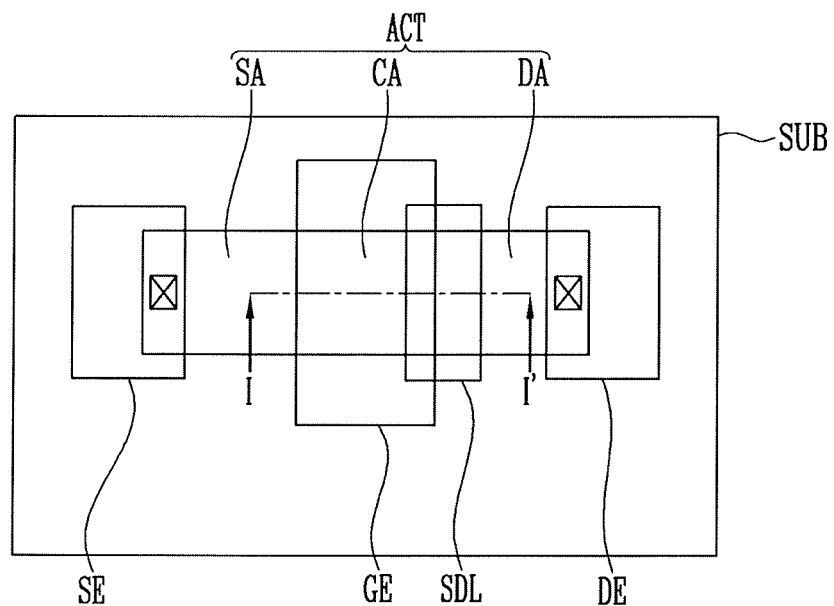
FIG. 1 is a plan view illustrating a thin film transistor according to an exemplary embodiment of the present invention.

Exemplary embodiments of the present invention will be described more fully hereinafter with reference to the accompanying drawings. It is to be understood that the present invention may, however, be embodied in different forms and thus should not be construed as being limited to the exemplary embodiments set forth herein. In the figures, like reference numerals may refer to like elements, and thus repetitive descriptions may be omitted.

In the drawings, the thickness of certain lines, layers, components, elements or features may be exaggerated for clarity. As used herein, the singular forms are intended to include the plural forms as well, unless the context clearly indicates otherwise.

It will be understood that when an element or layer is referred to as being "on" another element or layer, the element or layer may be directly on another element or layer, or intervening elements or layers may be present.

Figure 2:
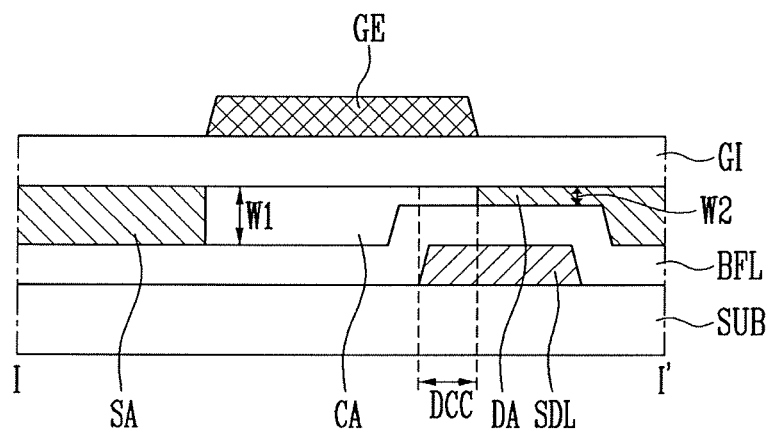
FIG. 2 is a sectional view taken along line I-I' of FIG. 1 according to an exemplary embodiment of the present invention.

FIG. 1 is a plan view illustrating a thin film transistor according to an exemplary embodiment of the present invention. FIG. 2 is a sectional view taken along line I-I' of FIG. 1 according to an exemplary embodiment of the present invention. In FIG. 2, for convenience of description, the illustration of a source electrode and a drain electrode is omitted to show an arrangement of a gate electrode GE, an active pattern ACT, and a blocking layer SDL.

Referring to FIGS. 1 and 2, the thin film transistor according to an exemplary embodiment of the present invention includes a gate electrode GE, an active pattern ACT, a source electrode SE, a drain electrode DE, and a blocking layer SDL, which are all provided on a substrate SUB.

The substrate SUB may be made of an insulative material such as glass, organic polymer, or quartz. In addition, the substrate SUB may be made of a flexible material to be bendable or foldable. The substrate SUB may be a single-layered structure or a multi-layered structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the aforementioned material that may constitute the substrate SUB may be variously changed.

The blocking layer SDL may be provided on the substrate SUB. The blocking layer SDL may be made of a conductive material, e.g., a metal. The blocking layer SDL may include of a single metal, but may include two or more kinds of metals, alloy of two or more kinds of metals, and/or the like. In addition, the blocking layer SDL may include a single layer or multiple layers. The blocking layer SDL may block light incident onto the back surface of the substrate SUB.

A buffer layer BFL may be provided on the blocking layer SDL. The buffer layer BFL may be made of an organic insulating material or inorganic insulating material. The inorganic insulating material may include a silicon oxide or silicon nitride.

A semiconductor layer may be provided in the form of a thin film on the buffer layer BFL. The semiconductor layer may be a semiconductor material that is undoped or doped with impurities. The semiconductor layer may include the active pattern ACT including a source region SA, a drain region DA, and a channel region CA provided between the source region SA and the drain region DA. The active pattern ACT may be a semiconductor pattern made of poly-silicon, amorphous silicon, oxide semiconductor, or the like. The channel region CA is a semiconductor pattern undoped with impurities, and may be an intrinsic semiconductor. The source region SA and the drain region DA may be semiconductor patterns doped with impurities. The impurities may include an n-type impurity, a p-type impurity, and other impurities such as other metals.

A gate insulating layer GI may be provided over the active pattern ACT. The gate insulating layer GI may be made of an inorganic insulating material including a silicon oxide or silicon nitride, but the present invention is not limited thereto. For example, the gate insulating layer may be made of an organic insulating material.

The gate electrode GE covering the channel region CA of the active pattern ACT may be provided on the gate insulating layer GI. The gate electrode GE may be made of a conductive material, e.g., a metal. The gate electrode GE may be used as an anti-doping layer that blocks the active pattern ACT from being doped with impurities. Accordingly, the gate electrode GE may prevent the channel region CA of the active pattern ACT from being doped with impurities.

An interlayer insulating layer may be provided over the gate electrode GE.

The source electrode SE and the drain electrode DE may be provided on the interlayer insulating layer.

The source electrode SE may be provided on the active pattern ACT to cover at least a portion of the active pattern ACT. The source electrode SE may be connected to the source region SA through a contact hole passing through the gate insulating layer GI and the interlayer insulating layer.

The drain electrode DE may be provided on the active pattern ACT to cover at least a portion of the active pattern ACT. The drain electrode DE may be spaced apart from the source electrode SE at a predetermined distance. The drain electrode DE may be connected to the drain region DA through a contact hole passing through the gate insulating layer GI and the interlayer insulating layer.

In an exemplary embodiment of the present invention, from a plan view, the blocking layer SDL may partially overlap with the drain region DA. In addition, from a plan view, the blocking layer SDL may partially overlap with the channel region CA.

A drain-channel contact part DCC may be disposed between the channel region CA and the drain region DA. The drain-channel contact part DCC is a region partially extending into the channel region CA in a width direction from a point at which the channel region CA and the drain region DA are in contact with each other. In addition, the drain-channel contact part DCC may be a portion of the active pattern ACT overlapping with the blocking layer SDL. The drain-channel contact part DCC has a width of about 3.5 μm or more.

To block light that is incident onto the back surface of the substrate SUB, e.g., the surface on which the active pattern ACT is not provided, the drain-channel contact part DCC may be overlapped by the blocking layer SDL. In other words, light from the drain channel contact part DCC is blocked. Accordingly, the light may be blocked from being incident onto the drain-channel contact part DCC by the blocking layer SDL.

In general, as the drain-channel contact part DCC is impacted by light incident from the outside environment, characteristics of the drain-channel contact part DCC may be impacted.

If light is incident onto the front surface of the substrate SUB, on which the active pattern ACT is provided, the gate electrode GE provided on the active pattern ACT blocks the light from being incident to the drain-channel contact part DCC. Thus, the drain-channel contact part DCC might not be impacted by the light. Therefore, in this case, the characteristics of the drain-channel contact part DCC might not be impacted.

In addition, in the case when the light is incident onto the back surface of the substrate SUB, if any component that blocks the light is not provided under the active pattern ACT, the drain-channel contact part DCC may be directly exposed to the light. Therefore, as the drain-channel contact part DCC reacts to the light, a level of an off current of the thin film transistor may increase, and thus, a leakage current may be generated.

In an exemplary embodiment of the present invention, the blocking layer SDL may be provided between the drain region DA and the channel region CA, so that light provided from the back surface of the substrate SUB can be blocked from being incident onto the drain-channel contact part DCC. In other words, the blocking layer SDL may partially overlap the drain region DA and the channel region CA to block the light from being incident onto the drain-channel contact part DCC. Accordingly, the leakage current of the thin film transistor caused by light incident onto the back surface of the substrate SUB may be minimized.

The blocking layer SDL may have various shapes that may block light, which is provided from the back surface of the substrate SUB, from being incident onto the drain-channel contact part DCC. In an exemplary embodiment of the present invention, from a plan view, the blocking layer SDL may have a quadrangular shape, but the present invention is not limited thereto. For example, the blocking layer SDL may have a polygonal shape or a circular shape.

FIGS. 3A to 3D are sectional views illustrating a manufacturing method of the thin film transistor of FIG. 1 according to an exemplary embodiment of the present invention.

Figure 3A:
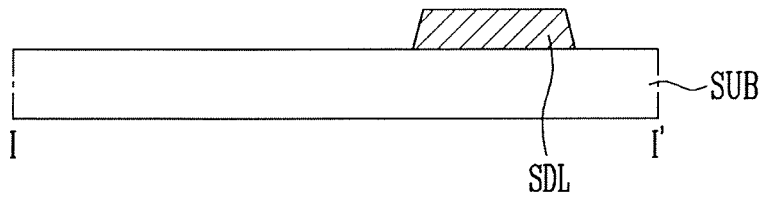
FIGS. 3A to 3D are sectional views illustrating a manufacturing method of the thin film transistor of FIG. 1 according to an exemplary embodiment of the present invention.

Referring to FIG. 3A, a blocking layer SDL is provided on the substrate SUB.

The blocking layer SDL may be formed by forming a conductive layer using a method of depositing a conductive material on the substrate SUB and patterning the conductive layer through a process such as photolithography. The conductive material may include, for example, a single kind or several kinds of metals, or any alloy thereof.

Figure 3B:
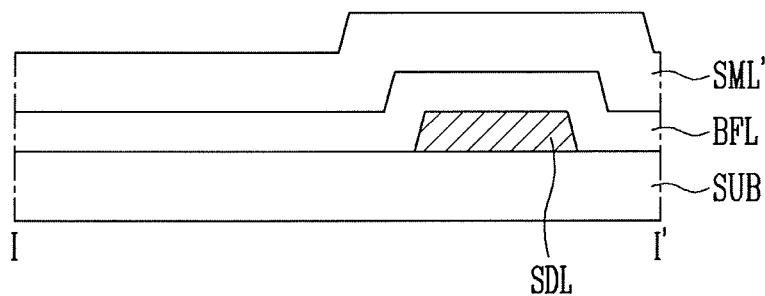

Referring to FIG. 3B, a buffer layer BFL and a semiconductor material layer SML' are formed over the blocking layer SDL.

The buffer layer BFL may be formed by depositing an insulating material on the front surface of the substrate SUB and the blocking layer SDL. The semiconductor material layer SML' may be made of, for example, amorphous silicon. The semiconductor material layer SML' may be formed by depositing the amorphous silicon on a front surface of the buffer layer BFL.

Figure 3C:
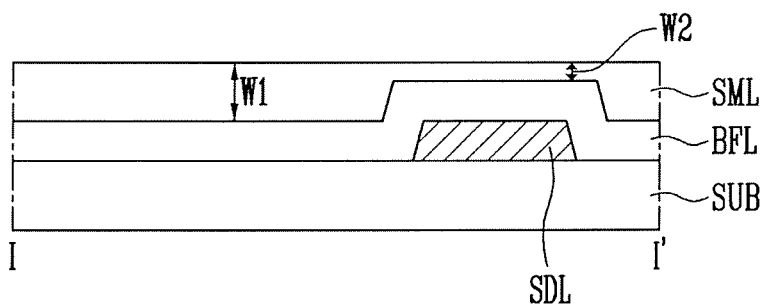

Referring to FIG. 3C, a semiconductor layer SML having different thicknesses may be formed by performing a planarization process on the semiconductor material layer (see SML' of FIG. 3B). The planarization process may be performed through chemical mechanical polishing (CMP), or the like.

The semiconductor layer SML subjected to the planarization process may include a first part W1 and a second part W2, which both have thicknesses different from each other. The first part W1 may be a region that does not overlap with the blocking layer SDL, and the second part W2 may be a region that overlaps with the blocking layer SDL. The thickness of the first part W1 may be greater than that of the second part W2.

Figure 3D:
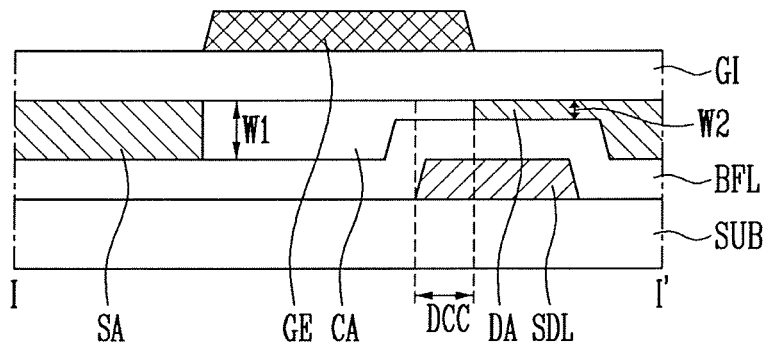

Referring to FIG. 3D, a gate insulating layer GI is formed on the semiconductor layer (see, e.g., SML of FIG. 3C).

Subsequently, a gate electrode GE is formed on the gate insulating layer GI.

Continuously, the substrate SUB, on which the gate electrode GE is formed, is doped with impurities. The semiconductor layer SML overlapping with the gate electrode GE may become a channel region CA undoped with the impurities. The regions of the semiconductor layer SML that are doped with impurities may become the source region SA and the drain region DA.

A portion the semiconductor layer SML that is connected to one end of the channel region CA and does not overlap with the gate electrode GE may become the source region SA. In addition, another portion of the semiconductor layer SML that is connected to the other end opposite to the one end of the channel region CA and does not overlap with the gate electrode GE may become the drain region DA. The source region SA, the drain region DA, and the channel region CA provided between the source region SA and the drain region DA constitute an active pattern (see, e.g., ACT of FIG. 1).

From a plan view, the channel region CA may partially overlap with the blocking layer SDL. Therefore, the channel region CA may be divided into the first part W1 that does not overlap with the blocking layer SDL and the second part W2 that overlaps with the blocking layer SDL. The thickness of the first part W1 may be greater than the thickness of the second part W2.

From a plan view, the drain region DA may partially overlap with the blocking layer SDL. Therefore, the drain region DA may include the first part W1 that does not overlap with the blocking layer SDL and the second part W2 that overlaps with the blocking layer SDL. The thickness of the first part W1 may be greater than the thickness of the second part W2. The first part W1 of the drain region DA may have substantially the same thickness as the first part W1 of the channel region CA, and the second part W2 of the drain region DA may have substantially the same thickness as the second part W2 of the channel region CA.

A drain-channel contact part DCC may be disposed between the drain region DA and the channel region CA. The drain-channel contact part DCC may be a region partially extending into the channel region CA from a point at which the channel region CA and the drain region DA are in contact with each other. In addition, the drain-channel contact part DCC may be a portion of the active pattern ACT overlapping with the blocking layer SDL. The drain-channel contact part DCC has a width of about 3.5 μm or more.

The drain-channel contact part DCC may be covered by the blocking layer SDL. Therefore, when light is incident onto the back surface of the substrate SUB, e.g., the surface on which the active pattern ACT is not provided, the light might not be provided to the drain-channel contact part DCC.

An interlayer insulating layer may be provided on the substrate SUB on which the gate electrode GE is provided. For example, the interlayer insulating layer may be provided on the gate electrode GE.

A source electrode (see, e.g., SE of FIG. 1) and a drain electrode (see, e.g., DE of FIG. 1), which are spaced apart from each other at a predetermined distance, may be provided on the interlayer insulating layer.

Figure 4:
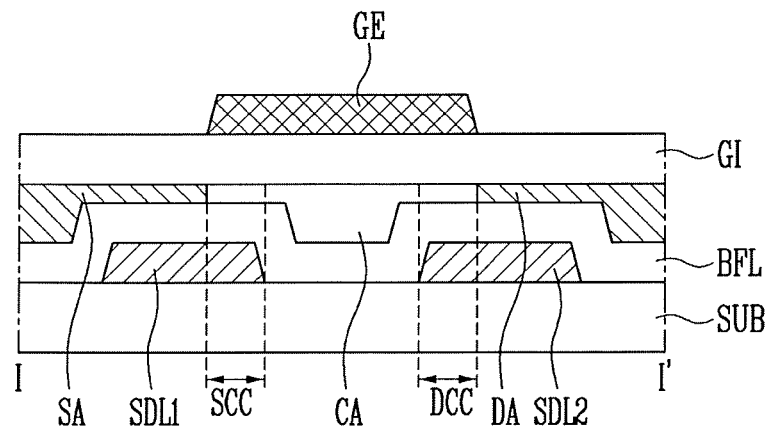
FIG. 4 is a sectional view illustrating a thin film transistor according to an exemplary embodiment of the present invention.

FIG. 4 is a sectional view illustrating a thin film transistor according to an exemplary embodiment of the present invention. In the thin film transistor according to an exemplary embodiment of the present invention, differences from the thin film transistor according to an above-described exemplary embodiment of the present invention may be described to avoid redundancy. Portions and elements that are not particularly described in the present exemplary embodiment may be assumed to be similar to portions and elements relating to the thin film transistor according to the above-described exemplary embodiments. In addition, identical reference numerals may refer to identical components, and similar reference numerals may refer to similar components. In FIG. 4, for convenience of description, an arrangement relation of a gate electrode, an active pattern, and a blocking layer is illustrated.

Referring to FIG. 4, the thin film transistor according to an exemplary embodiment of the present invention includes a gate electrode GE, a channel region CA, a source region SA, a drain region DA, a first blocking layer SDL1, and a second blocking layer SDL2, which are provided on a substrate SUB. The channel region CA, the source region SA, and the drain region DA may constitute an active pattern (see, e.g., ACT of FIG. 1).

The first blocking layer SDL1 may be provided on the same layer as the second blocking layer SDL2. From a plan view, the first blocking layer SDL1 may partially overlap with the source region SA. In addition, the first blocking layer SDL1 may partially overlap with the channel region CA of the active pattern ACT.

A source-channel contact part SCC may be disposed between the source region SA and the channel region CA. The source-channel contact part SCC may be a region partially extending into of the channel region CA from a point at which the channel region CA and the source region SA are in contact with each other. In addition, the source-channel contact part SCC may be a portion the active pattern ACT overlapping with the first blocking layer SDL1. The source-channel contact part SCC may have a width of about 3.5 µm or more.

To block light that is incident onto the back surface of the substrate SUB, e.g., the surface on which the active pattern ACT is not provided, the source-channel contact part SCC may be overlapped by the first blocking layer SDL1. In other words, light from the source-channel contact part SCC is blocked. Accordingly, the light may be blocked from being incident onto the source-channel contact part SCC by the first blocking layer SDL1.

From a plan view, the second blocking layer SDL2 may partially overlap with the drain region DA. In addition, the second blocking layer SDL2 may partially overlap with the channel region CA of the active pattern ACT.

A drain-channel contact part DCC may be disposed between the drain region DA and the channel region CA. The drain-channel contact part DCC may be a region partially extending into the channel region CA from a point at which the channel region CA and the drain region DA are in contact with each other. In addition, the drain-channel contact part DCC may be a portion of the active pattern ACT overlapping with the second blocking layer SDL2. The drain-channel contact part DCC may have the same width as the source-channel contact part SCC, but the present invention is not limited thereto. For example, the drain-channel contact part DCC and the source-channel contact part SCC may have different widths from each other.

To block light, which is incident on the back surface of the substrate SUB, from the drain-channel contact part DCC, the drain-channel contact part DCC may be overlapped by the second blocking layer SDL2. Accordingly, the light may be blocked from being incident onto the drain-channel contact part DCC by the second blocking layer SDL2.

Figure 5:
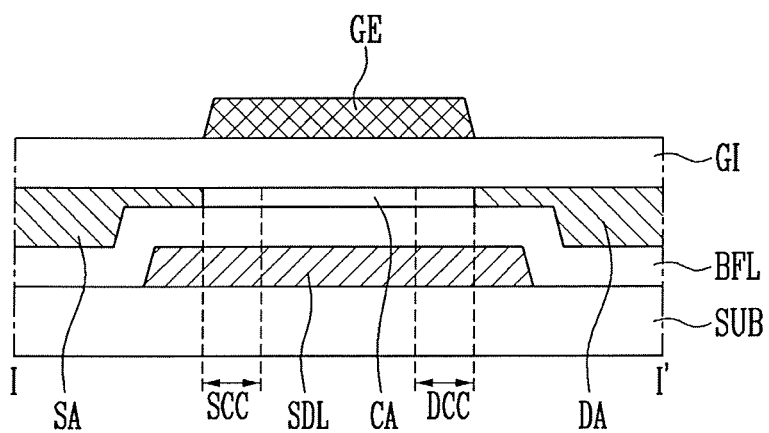
FIG. 5 is a sectional view illustrating a thin film transistor according to an exemplary embodiment of the present invention.

FIG. 5 is a sectional view illustrating a thin film transistor according to an exemplary embodiment of the present invention. In the thin film transistor according to an exemplary embodiment of the present invention, differences from the thin film transistor according to an above-described exemplary embodiment of the present invention may be described to avoid redundancy. Portions and elements that are not particularly described in the present exemplary embodiment may be similar to portions and elements relating to the thin film transistor according to the above-described exemplary embodiment. In addition, identical reference numerals may refer to identical components, and similar reference numerals may refer to similar components. In FIG. 5, for convenience of description, an arrangement relation of a gate electrode, an active pattern, and a blocking layer is illustrated.

Referring to FIG. 5, the thin film transistor, according to an exemplary embodiment of the present invention, includes a gate electrode GE, a channel region CA, a source region SA, a drain region DA, and a blocking layer SDL, which are all provided on a substrate SUB. The channel region CA, the source region SA, and the drain region DA may constitute an active pattern (see, e.g., ACT of FIG. 1).

The blocking layer SDL may be disposed on the substrate SUB and under the source region SA, the channel region CA, and the drain region DA. From a plan view, the blocking layer SDL may partially overlap with the source region SA, the channel region CA, and the drain region DA. Therefore, when light is incident onto the back surface of the substrate SUB, e.g., the surface on which the active pattern ACT is not provided, the light may be blocked by the blocking layer SDL and, hence, might not be provided to the active pattern ACT. The blocking layer SDL completely covers a drain-channel contact part DCC disposed between the drain region DA and the channel region CA, so that the light may be blocked from being incident onto the drain-channel contact part DCC. In addition, the blocking layer SDL completely covers a source-channel contact part SCC disposed between the source region SA and the channel region CA, so that the light may be blocked from being incident onto the source-channel contact part SCC.

Figure 6:
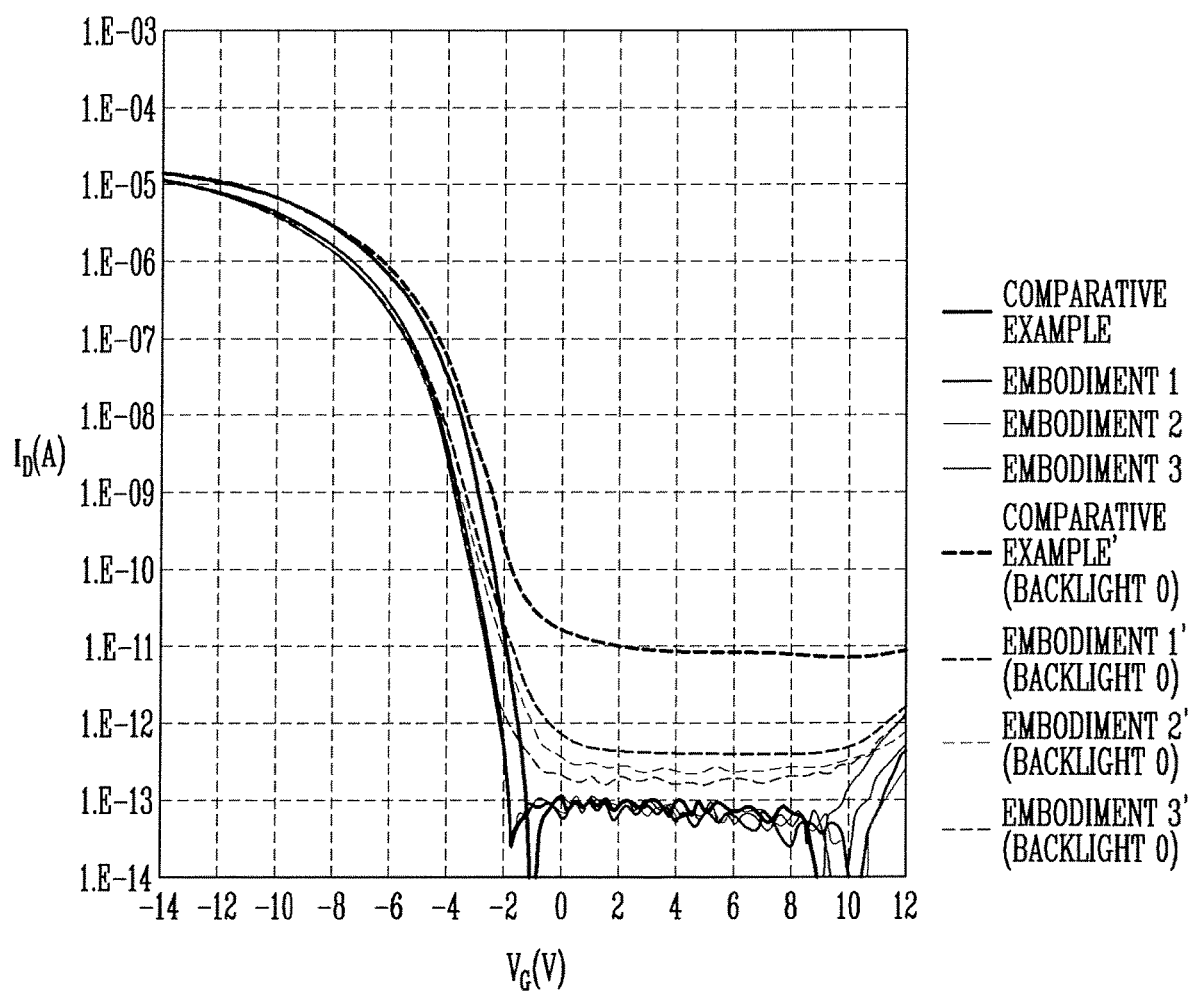
FIG. 6 is a graph illustrating current ($I_D$) between a drain electrode and a source electrode with respect to gate voltage ($V_G$) in a conventional thin film transistor and thin film transistors according to according to an exemplary embodiment of the present invention.

FIG. 6 is a graph illustrating current ($I_D$) between a drain electrode and a source electrode with respect to gate voltage ($V_G$) in a conventional thin film transistor and thin film transistors according to according to an exemplary embodiment of the present invention.

In FIG. 6, Comparative Example represents measurement values of an existing thin film transistor when light is not irradiated onto the back surface of a substrate, and Comparative Example' represents measurement values of the existing thin film transistor when light is irradiated onto the back surface of the substrate.

Embodiment 1 represents measurement values of a thin film transistor according to an exemplary embodiment of the present invention when light is not irradiated onto the back surface of a substrate. Embodiment represents measurement values of the thin film transistor according to the exemplary embodiment of the present invention when light is irradiated onto the back surface of the substrate. The thin film transistor according to Embodiment 1 and Embodiment 1' includes a drain-channel contact part having a width of about 2.5 μm.

Embodiment 2 represents measurement values of a thin film transistor according to an exemplary embodiment of the present invention when light is not irradiated onto the back surface of a substrate. Embodiment 2' represents measurement values of the thin film transistor according to the exemplary embodiment of the present invention when light is irradiated onto the back surface of the substrate. The thin film transistor according to Embodiment 2 and Embodiment 2' includes a drain-channel contact part having a width of about 3.5 μm.

Embodiment 3 represents measurement values of a thin film transistor according to an exemplary embodiment of the present invention when light is not irradiated onto the back surface of a substrate. Embodiment 3' represents measurement values of the thin film transistor according to the exemplary embodiment of the present invention when light is irradiated onto the back surface of a substrate.

Referring to FIG. 6, when light is not irradiated onto the back surface of the substrate, graphs of the existing thin film transistor and the thin film transistors according to exemplary embodiments of the present invention are similar to each other.

When light is irradiated onto the back surface of the substrate, it has been observed that the level of an off current of the existing thin film transistor increases. This is because the existing thin film transistor does not include a separate component that blocks the light (e.g., a blocking layer) under an active pattern. In addition, in the thin film transistors according to the exemplary embodiments of the present invention, the level of an off current of the thin film transistor does not increase even when light is irradiated onto the back surface of the substrate. This is because, the thin film transistors according to the exemplary embodiments of the present invention, a blocking layer (see, e.g., SDL of FIG. 1) is disposed under and overlaps an active pattern to block the light from being incident onto the active pattern.

The thin film transistors according to the exemplary embodiments of the present invention may be included in various electronic devices, e.g., display devices. According to an exemplary embodiment of the present invention, a display device includes a display element for displaying an image and a thin film transistor connected to the display element, and each of the thin film transistors according to the exemplary embodiments of the present invention may be employed as thin film transistor of the display device.

Figure 7:
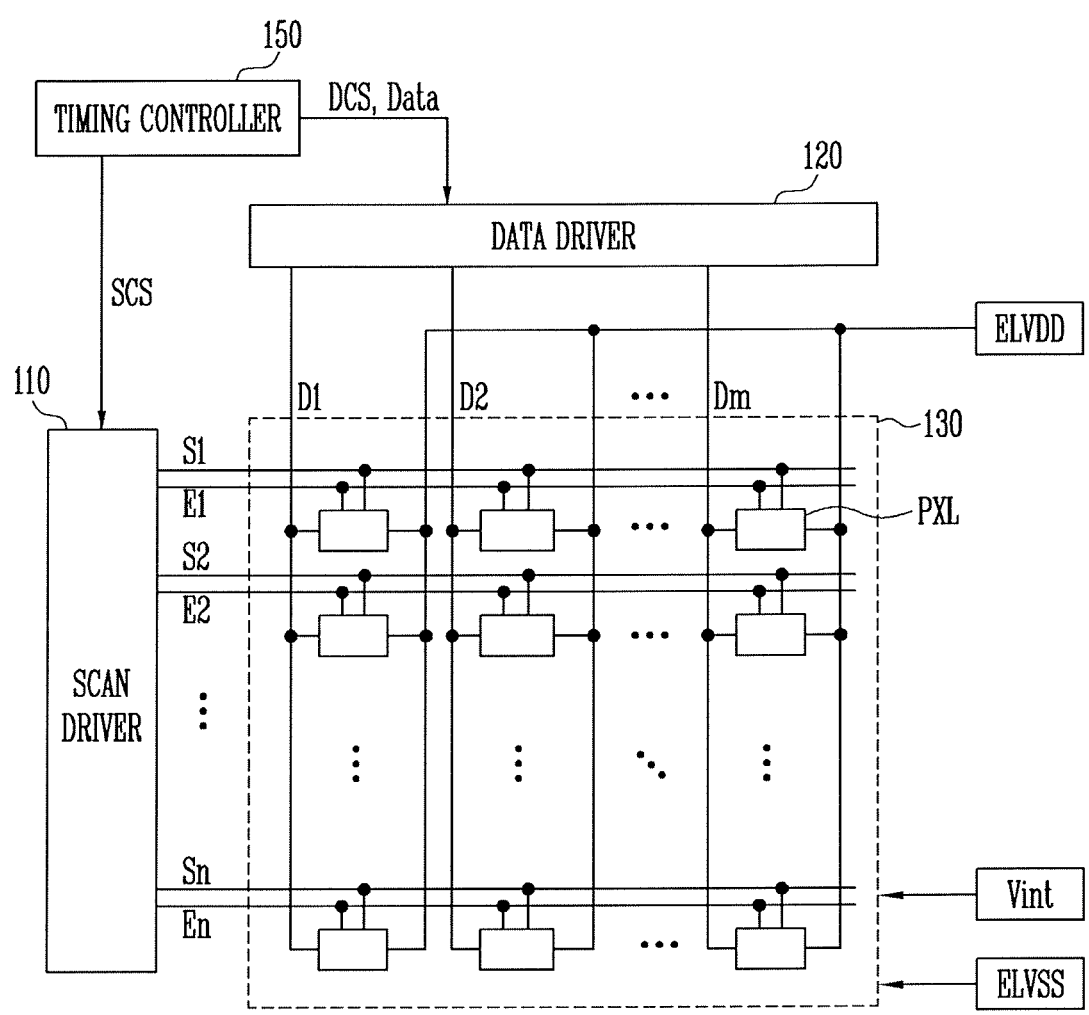
FIG. 7 is a diagram illustrating a display device according to an exemplary embodiment of the present invention.

FIG. 7 is a diagram illustrating a display device according to an exemplary embodiment of the present invention.

Referring to FIG. 7, the display device according to an exemplary embodiment of the present invention may include a scan driver 110, a data driver 120, a pixel unit 130 including pixels PXL, and a timing controller 150.

The pixel unit 130 includes pixels PXL located in regions which are arranged with intersections of scan lines S1 to Sn extending in a horizontal direction and data lines D1 to Dm extending in vertical direction. Each pixel PXL is connected to a data line D1 to Dm and a scan line S1 to Sn. In FIG. 7, it is illustrated that the pixel unit 130 includes m×n pixels PXL. "m" and "n" may be natural numbers. The pixels PXL are supplied with a first power source ELVDD and a second power source ELVSS from the outside. In an exemplary embodiment of the present invention, the second power source ELVSS may be set to have a lower voltage than the first power source ELVDD. Pixels PXL are supplied with a data signal in response to a scan signal supplied to the scan lines S1 to Sn. Each of the pixels PXL supplied with the data signal generates light with a predetermined luminance while controlling the amount of current flowing in the second power source ELVSS via a light emitting device OLED from the first power source ELVDD, corresponding to the data signal. Each of the pixels PXL in the pixel unit 130 shown in FIG. 7 may be a sub-pixel included in a unit pixel. In other words, each of the pixels PXL may be a sub-pixel that generates light of any one color among red, green, and blue, but the present invention is not limited thereto.

The timing controller 150 generates a data driving control signal DCS and a scan driving control signal SCS, corresponding to synchronization signals supplied from the outside (e.g., an external device). The data driving control signal DCS generated from the timing controller 150 is supplied to the data driver 120, and the scan driving control signal SCS generated from the timing controller 150 is supplied to the scan driver 110. In addition, the timing controller 150 realigns data supplied from the outside and supplies the realigned data Data to the data driver 120.

The scan driving control signal SCS may include start pulses and clock signals. The start pulses control first timings of a scan signal and a light emitting control signal. The clock signals are used to shift the start pulses.

The data driving control signal DCS may include a source start pulse and clock signals. The source start pulse controls a sampling start point of data. The clock signals are used to control a sampling operation.

The scan driver 110 is supplied with the scan driving control signal SCS from the timing controller 150. The scan driver 110 supplied with the scan driving control signal SCS supplies the scan signal to the scan lines S1 to Sn. For example, the scan driver 110 may sequentially supply the scan signal to the scan lines S1 to Sn. If the scan signal is sequentially supplied to the scan lines S1 to Sn, the pixels are selected in units of horizontal lines.

In addition, the scan driver 110 supplied with the scan driving control signal SCS supplies a light emitting control signal to light emitting control lines E1 to En extending in the horizontal direction. For example, the scan driver 110 may sequentially supply the light emitting control signal to the light emitting control lines E1 to En. The light emitting control signal is used to control light emitting times of the pixels PXL. To this end, the light emitting control signal may be set to have a wider width than the scan signal. For example, the scan driver 110 may supply the scan signal to an (i−1)th (i is a natural number) scan line Si−1 and an ith scan line Si such that the scan signal overlaps with the light emitting control signal supplied to an ith light emitting control line Ei.

The data driver 120 supplies the data signal to the data lines D1 to Dm, corresponding to the data driving control signal DCS. The data signal supplied to the data lines D1 to Dm is supplied to the pixels PXL that received the scan signal. To this end, the data driver 120 may supply the data signal to the data lines D1 to Dm such that the data signal is synchronized with the scan signal.

Figure 8:
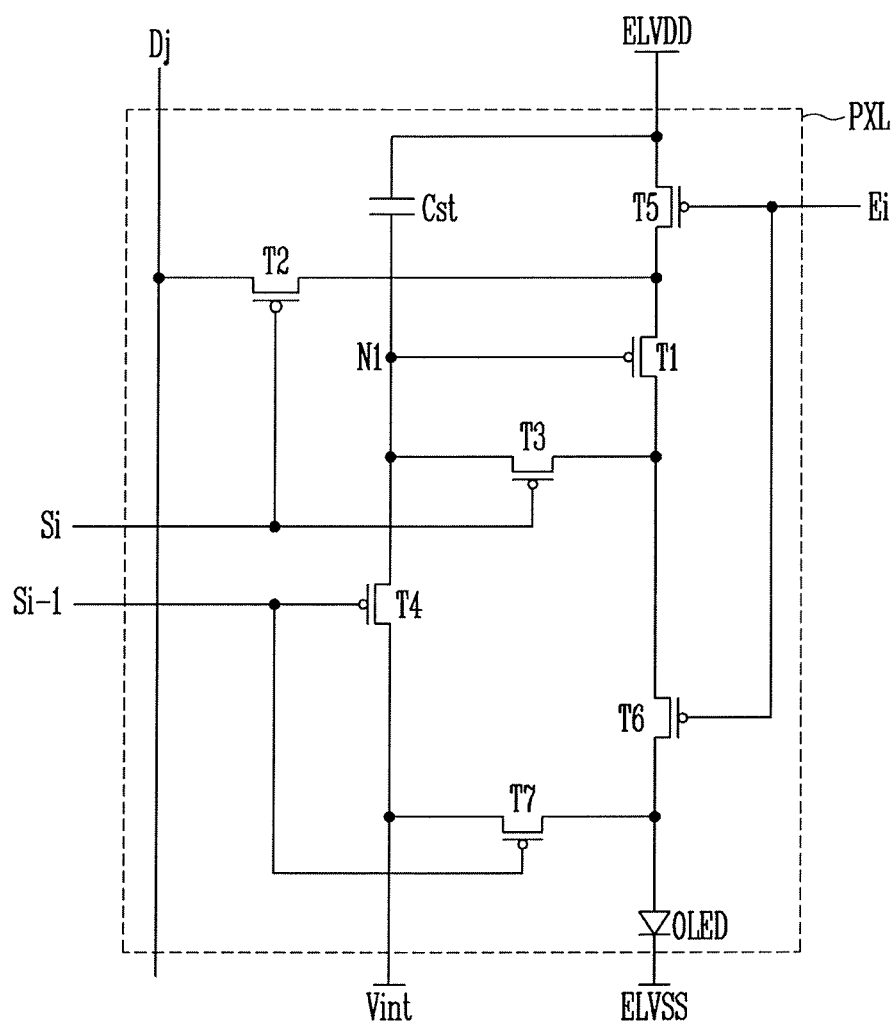
FIG. 8 is a circuit diagram illustrating a pixel shown in FIG. 7 according to an exemplary embodiment of the present invention.

FIG. 8 is a circuit diagram illustrating a pixel PXL shown in FIG. 7 according to an exemplary embodiment of the present invention. A pixel PXL located on an ith (i is a natural number smaller than n) row and a jth (j is a natural number smaller than m) column is illustrated in FIG. 8.

Referring to FIGS. 7 and 8, the pixel PXL according to an exemplary embodiment of the present invention may include a light emitting device OLED, first to seventh thin film transistors T1 to T7, and a storage capacitor Cst.

An anode of the light emitting device OLED is connected to the first thin film transistor T1 via the sixth thin film transistor T6, and the cathode is connected to the second power source ELVSS. The first thin film transistor T1 is connected to the first power source ELVDD. The light emitting device OLED may generate light with a predetermined luminance corresponding to the amount of current supplied from the first power source ELVDD and through the first thin film transistor T1. In this case, the first power source ELVDD may be set to a higher voltage than the second power source ELVSS such that current may flow in the light emitting device OLED.

The seventh thin film transistor T7 is located between an initialization power source Vint and the anode of the light emitting device OLED to be connected to the initialization power source Vint and the anode of the light emitting device OLED. A gate electrode of the seventh thin film transistor T7 is connected to an (i−1)th scan line Si−1. The seventh thin film transistor T7 is turned on when an (i−1)th scan signal is supplied to the (i−1)th scan line Si−1 to supply a voltage of the initialization power source Vint to the anode of the light emitting device OLED. The initialization power source Vint may be set to a lower voltage than a data signal, but the present invention is not limited thereto.

The sixth thin film transistor T6 is located between the first thin film transistor T1 and the light emitting device OLED to be connected to each of the first thin film transistor T1 and the light emitting device OLED. A gate electrode of the sixth thin film transistor T6 is connected to an ith light emitting control line Ei. The sixth thin film transistor T6 is turned off when an ith light emitting control signal is supplied to the ith light emitting control line Ei, and turned on when no ith light emitting control signal is supplied to the ith light emitting control line Ei.

The fifth thin film transistor T5 is located between the first power source ELVDD and the first thin film transistor T1 to be connected to each of the first power source ELVDD and the first thin film transistor T1. A gate electrode of the fifth thin film transistor 15 is connected to the ith light emitting control line Ei. The fifth thin film transistor T5 is turned off when the ith light emitting control signal is supplied to the ith light emitting control line Ei, and turned on when no ith light emitting control signal is supplied to the ith light emitting control line Ei.

A first electrode of the first thin film transistor (e.g., a driving transistor) T1 is connected to the first power source ELVDD via the fifth thin film transistor T5, and a second electrode of the first thin film transistor T1 is connected to the anode of the light emitting device OLED via the sixth thin film transistor T6. A gate electrode of the first thin film transistor T1 is connected to a first node N1. The first thin film transistor T1 controls the amount of current flowing from the first power source ELVDD to the second power source ELVSS via the light emitting device OLED, corresponding to a voltage of the first node N1.

The third thin film transistor T3 is located between the first thin film transistor T1 and the first node N1 to be connected to each of the first thin film transistor T1 and the first node N1. A gate electrode of the third thin film transistor T3 is connected to an ith scan line Si. The third thin film transistor T3 is turned on when an ith scan signal is supplied to the ith scan line Si and the gate electrode of the third thin film transistor T3 to allow the second electrode of the first thin film transistor T1 to be electrically connected to the first node N1 through the third thin film transistor T3. Thus, the first thin film transistor T1 can be diode-connected when the third thin film transistor T3 is turned on.

The fourth thin film transistor T4 is located between the first node N1 and the initialization power source Vint to be connected to each of the first node N1 and the initialization power source Vint. A gate electrode of the fourth thin film transistor 14 is connected to the (i−1)th scan line Si−1. The fourth thin film transistor T4 is turned on when the (i−1)th scan signal is supplied to the (i−1)th scan line Si−1 and the gate electrode of the fourth thin film transistor T4 to supply a voltage of the initialization power source Vint to the first node N1.

The second thin film transistor (e.g., a switching transistor) T2 is located between a jth data line Dj and the first thin film transistor T1 to be connected to each of the jth data line Dj and the first electrode of the first thin film transistor T1. A gate electrode of the second thin film transistor T2 is connected the ith scan line Si. In addition, the second thin film transistor T2 is turned on when the ith scan signal is supplied to the ith scan line Si and the gate electrode of the second thin film transistor T2 so that the jth data line Dj may be electrically connected to the first electrode of the first thin film transistor T1. The second thin film transistor T2 is turned on in response to the ith scan signal provided through the ith scan line Si to perform a switching operation of transmitting a data signal provided from the jth data line Dj to the first electrode of the first thin film transistor T1.

The storage capacitor Cst is located between the first power source ELVDD and the first node N1 to be connected to each of the first power source ELVDD and the first node N1. The storage capacitor Cst stores a voltage corresponding to a jth data signal and a threshold voltage of the first thin film transistor T1.

Figure 9:
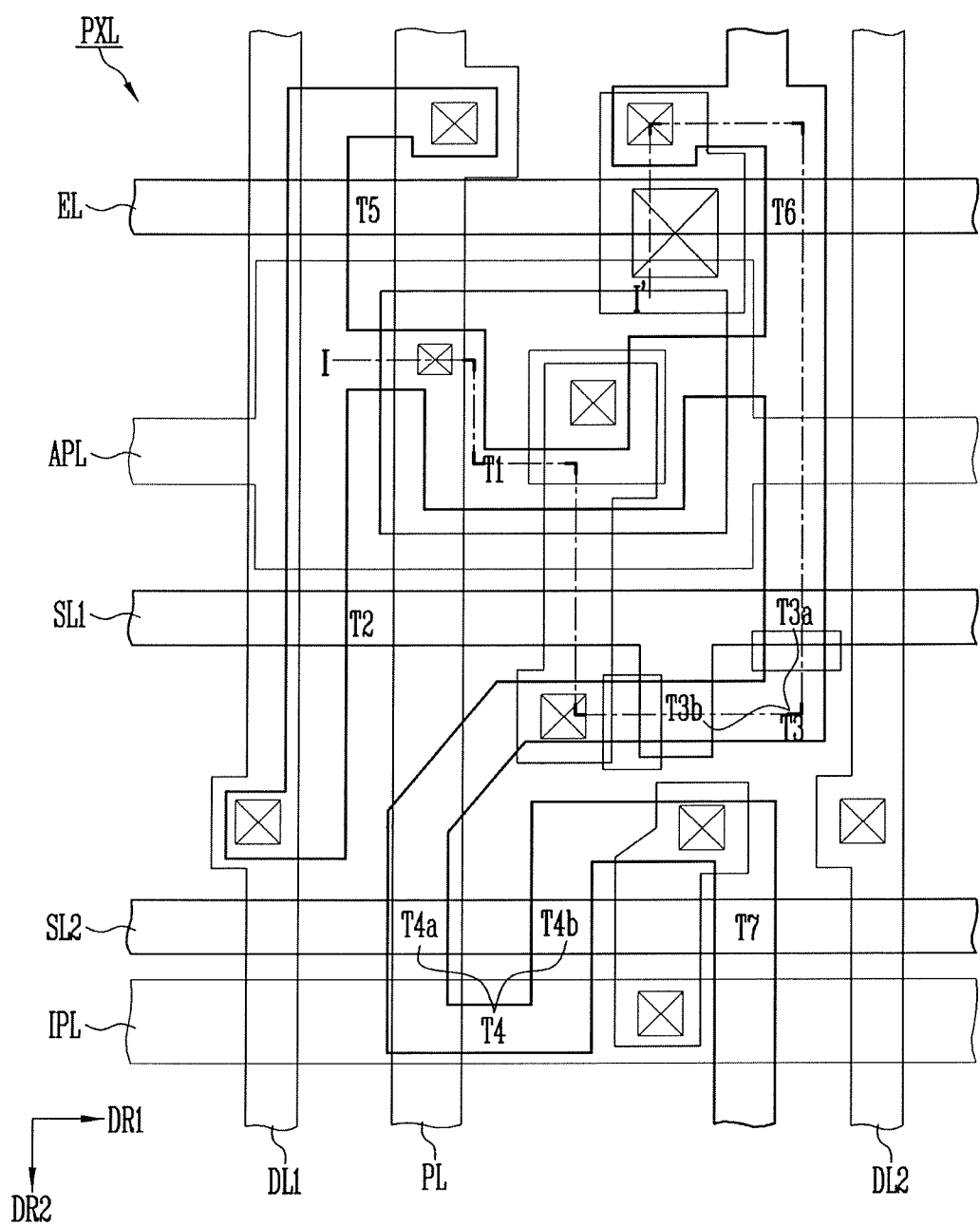
FIG. 9 is a plan view implementing the pixel of FIG. 8, which illustrates positions of thin film transistors, according to an exemplary embodiment of the present invention.
Figure 10:
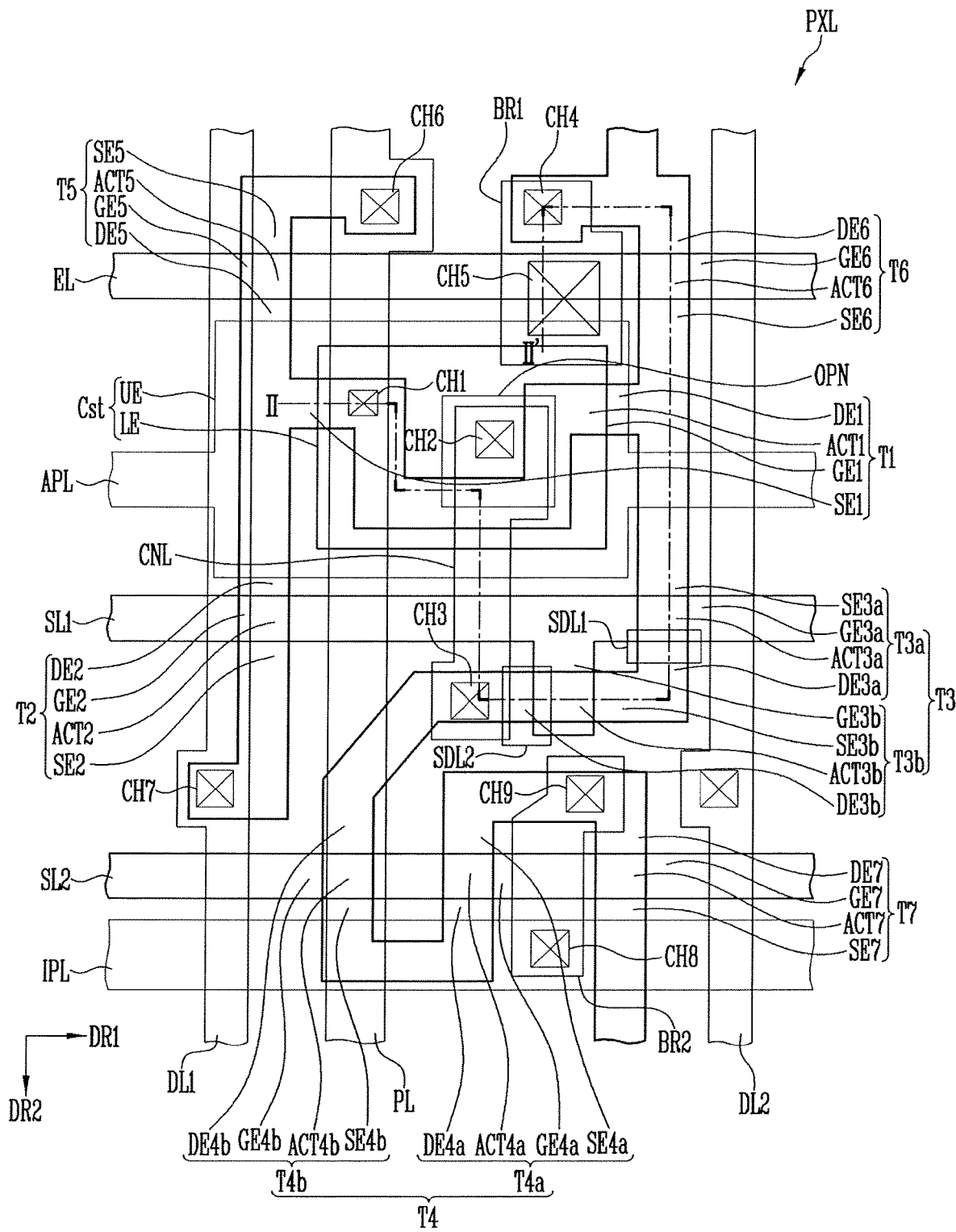
FIG. 10 is a plan view illustrating in detail the pixel of FIG. 9 according to an exemplary embodiment of the present invention.
Figure 11:
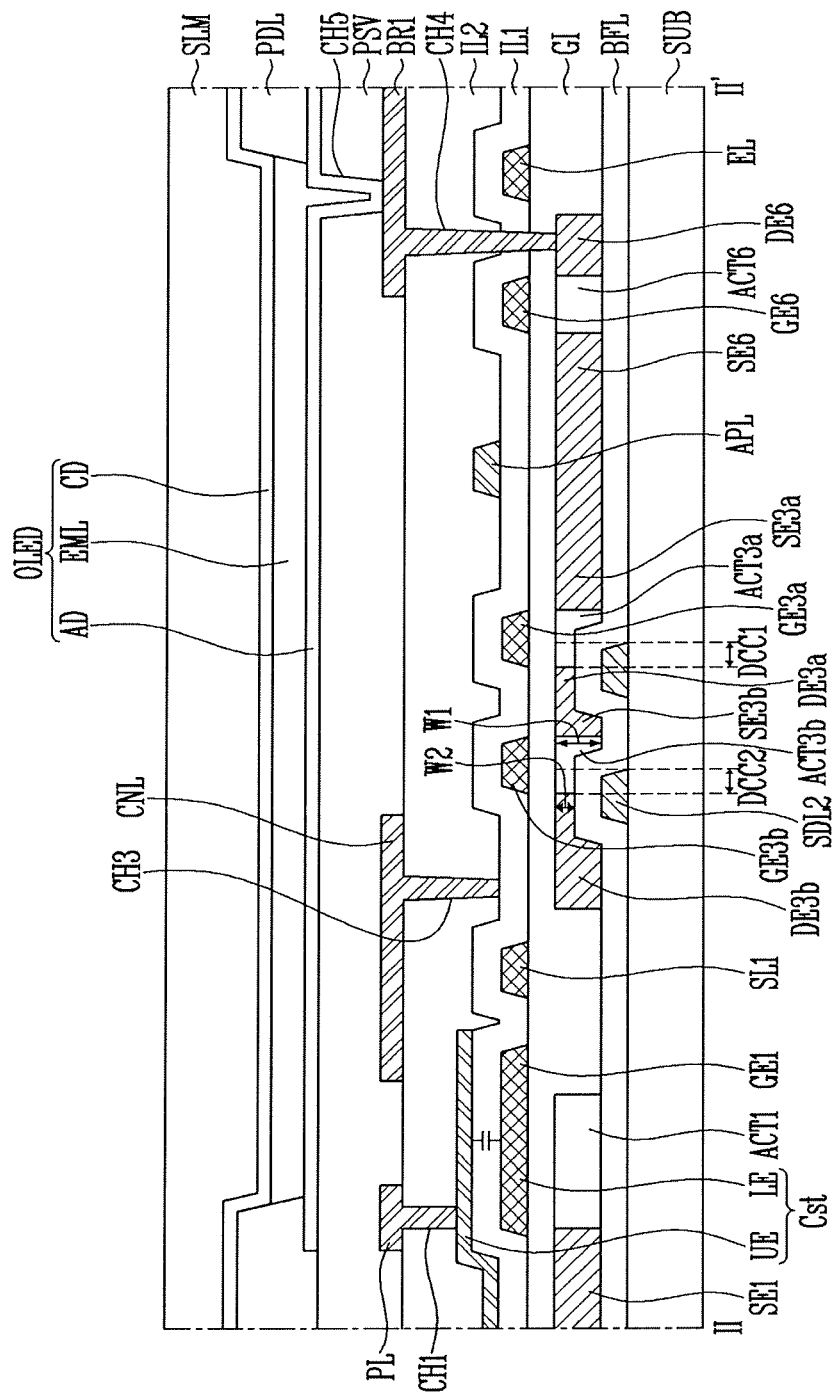
FIG. 11 is a sectional view taken along line II-II' of FIG. 10 according to an exemplary embodiment of the present invention.

FIG. 9 is a plan view implementing the pixel of FIG. 8, which illustrates positions of thin film transistors, according to an exemplary embodiment of the present invention. FIG. 10 is a plan view illustrating in detail the pixel of FIG. 9 according to an exemplary embodiment of the present invention. FIG. 11 is a sectional view taken along line II-II' of FIG. 10 according to an exemplary embodiment of the present invention. In FIGS. 9 to 11, for convenience of description, regarding lines provided to one pixel PXL, one of the scan lines SL1 and SL2 to which a scan signal is applied is designated as a "first scan line SL1," the other scan line is designated as a "second scan line SL2." In addition, a light emitting control line EL, to which a light emitting control signal is applied, is designated as a "a light emitting control line EL." Further, a data line DL1 to DL2 which a data signal is applied, is designated as a "data line DL1." In addition, a power line PL, to which the first power source ELVDD is applied, is designated as a "power line PL." Further, an initialization power line IPL, to which the initialization power source Vint is applied, is designated as an "initialization power line IPL." DL2 represents a data line of an adjacent pixel PXL.

Referring to FIGS. 8 to 11, the display device according to an exemplary embodiment of the present invention includes a substrate SUB, a line unit, and pixels PXL.

The substrate SUB may include an insulative material such as glass, organic polymer, or quartz. The substrate SUB may be made of a flexible material to be bendable or foldable. The substrate SUB may be a single-layered structure or a multi-layered structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be variously changed.

The line units provide a signal to each pixel PXL, and includes scan lines SL1 and SL2, a data line DL1, a light emitting control line EL, a power line PL, an initialization power line IPL, and an auxiliary power line APL.

The scan lines SL1 and SL2 extend in a first direction DR1, and includes a first scan line SL1 and a second scan line SL2, which are sequentially arranged along a second direction DR2 intersecting the first direction DR1. In other words, the first scan line SL1 and the second scan line SL2 are parallel to each other. Scan signals are provided to each of the scan lines SL1 and SL2. An (i−1)th scan signal is applied to the first scan line SL1, and an ith scan signal is applied to the second scan line SL2.

The light emitting control line EL extends in the first direction DR1, and may be disposed to be spaced part from the first scan line SL1. For example, in a plan view and along the second direction DR2, the light emitting control line EL may be disposed above the first scan line SL1. A light emitting control signal is applied to the light emitting control line EL.

The power line PL extends along the second direction DR2, and may be disposed to be spaced apart from the data line DL1.

The initialization power line IPL extends along the first direction DR1, and may be provided between the second scan line SL2 and a light emitting control line EL of a pixel on a next row.

The auxiliary power line APL extends along the first direction DR1, and may be disposed between the light emitting control line EL and the first scan line SL1. The first power source ELVDD may be applied to the auxiliary power line APL and the power line PL.

Each pixel PXL may include first to seventh thin film transistors T1 to T7, a storage capacitor Cst, a light emitting device OLED, and bridge patterns BR1 and BR2.

The first thin film transistor T1 includes a first gate electrode GE1, a first active pattern ACT1, a first source electrode SE1, a first drain electrode DE1, and a connection line CNL.

The first gate electrode GE1 is connected to a third drain electrode DE3 of the third thin film transistor T3 and a fourth drain electrode DE4 of the fourth thin film transistor T4. The connection line CNL connects between the first gate electrode GE1 and each of the third drain electrode DE3 and the fourth drain electrode DE4. The connection line CNL connects the first gate electrode GE1 to each of the third drain electrode DE3 and the fourth drain electrode DE4 through second and third contact holes CH2 and CH3.

In exemplary an embodiment of the present invention, the first active pattern ACT1, the first source electrode SE1, and the first drain electrode DE1 may be formed of a semiconductor layer which may be undoped or doped with impurities. The source electrode SE1 and the first drain electrode DE1 may be formed of a semiconductor layer doped with impurities, and the first active pattern ACT1 may be formed of a semiconductor layer undoped with impurities.

The first active pattern ACT1 may have a polygonal shape with a plurality of bent portions, and extends along a first direction DR1. From a plan view, the first active pattern ACT1 may partially overlap with the first gate electrode GE1.

The first source electrode SE1 is connected to one end of the first active pattern ACT1, and is connected to each of a second drain electrode DE2 of the second thin film transistor T2 and a fifth drain electrode DE5 of the fifth thin film transistor T5. The first drain electrode DE1 is connected to the other end of the first active pattern ACT1, and is connected to each of a third source electrode SE3 of the third thin film transistor T3 and a sixth source electrode SE6 of the sixth thin film transistor T6.

The second thin film transistor T2 includes a second gate electrode GE2, a second active pattern ACT2, a second source electrode SE2, and the second drain electrode DE2.

The second gate electrode GE2 is connected to the first scan line SL1. The second gate electrode GE2 may be provided as a portion of the first scan line SL1, but the present invention is not limited thereto. For example, the second gate electrode GE2 may be provided in a shape protruding from the first scan line SL1. In an exemplary embodiment of the present invention, the second active pattern ACT2, the second source electrode SE2, and the second drain electrode DE2 may be formed of a semiconductor layer which may be undoped or doped with impurities. The second active pattern ACT2 corresponds to a portion of the semiconductor layer overlapping with the second gate electrode GE2. One end of the second source electrode SE2 is connected to one end of the second active pattern ACT2, and the other end of the second source electrode SE2 is connected to the data line DL1 through a seventh contact hole CH7. One end of the second drain electrode DE2 is connected to the other end of second active pattern ACT2, and the other end of the second drain electrode DE2 is connected to the first source electrode SE1 of the first thin film transistor T1 and the fifth drain electrode DE5 of the fifth thin film transistor T5.

The third thin film transistor T3 may be provided as a dual gate structure to prevent leakage current. In other words, the third thin film transistor 13 may include a 3ath thin film transistor T3a and a 3bth thin film transistor T3b. The 3ath thin film transistor T3a may include a 3ath gate electrode GE3a, a 3ath active pattern ACT3a, a 3ath source electrode SE3a, and a 3ath drain electrode DE3a. The 3bth thin film transistor T3b may include a 3bth gate electrode GE3b, a 3bth active pattern ACT3b, a 3bth source electrode SE3b, and a 3bth drain electrode DE3b. Hereinafter, for convenience of description, the 3ath gate electrode GE3a and the 3bth gate electrode GE3b are referred to as a third gate electrode GE3, the 3ath active pattern ACT3a and the 3bth active pattern ACT3b are referred to as a third active pattern ACT3, the 3ath source electrode SE3a and the 3bth source electrode SE3b are referred to as a third source electrode SE3, and the 3ath drain electrode DE3a and the 3bth drain electrode DE3b are referred to as a third drain electrode DE3.

The third gate electrode GE3 is connected to the first scan line SL1. The third gate electrode GE3 is provided as a portion of the first scan line SL1 or provided in a shape protruding from the first scan line SL1. In exemplary an embodiment of the present invention, the third active pattern ACT3, the third source electrode SE3, and the third drain electrode DE3 may be formed of a semiconductor layer which may be undoped or doped with impurities. The third source electrode SE3 and the third drain electrode DE3 may be formed of a semiconductor layer doped with impurities, and the third active pattern ACT3 may be formed of a semiconductor layer undoped with impurities. The third active pattern ACT3 corresponds to a portion of the semiconductor layer overlapping with the third gate electrode GE3. One end of the third source electrode SE3 is connected to the third active pattern ACT3, and the other end of the third source electrode SE3 is connected to the first drain electrode DE1 of the first thin film transistor T1 and the sixth source electrode SE6 of the sixth thin film transistor. One end of the third drain electrode DE3 is connected to the third active pattern ACT3, and the other end of the third drain electrode DE3 is connected to the fourth drain electrode DE4 of the fourth thin film transistor T4. In addition, the third drain electrode DE3 is connected to the first gate electrode GE1 of the first thin film transistor T1 through the connection line CNL and the second and third contact holes CH2 and CH3.

The fourth thin film transistor T4 may be provided as a dual gate structure to prevent leakage current. In other words, the fourth thin film transistor T4 may include a 4ath thin film transistor T4a and a 4bth thin film transistor T4b. The 4ath thin film transistor T4a may include a 4ath gate electrode GE4a, a 4ath active pattern ACT4a, a 4ath source electrode SE4a, and a 4ath drain electrode DE4a. The 4bth thin film transistor T4b may include a 4bth gate electrode GE4b, a 4bth active pattern ACT4b, a 4bth source electrode SE4b, and a 4bth drain electrode DE4b. Hereinafter, for convenience of description, the 4ath gate electrode GE4a and the 4bth gate electrode GE4b are referred to as a fourth gate electrode GE4, the 4ath active pattern ACT4a and the 4bth active pattern ACT4b are referred to as a fourth active pattern ACT4, the 4ath source electrode SE4a and the 4bth source electrode SE4b are referred to as a fourth source electrode SE4, and the 4ath drain electrode DE4a and the 4bth drain electrode DE4b are referred to as a fourth drain electrode DE4.

The fourth gate electrode GE4 is connected to the second scan SL2. The fourth gate electrode GE4 is provided as a portion of the second scan line SL2 or provided in a shape protruding from the second scan line SL2. In an exemplary embodiment of the present invention, the fourth active pattern ACT4, the fourth source electrode SE4, and the fourth drain electrode DE4 may be formed of a semiconductor layer which may be undoped or doped with impurities. The fourth source electrode SE4 and the fourth drain electrode DE4 may be formed of a semiconductor layer doped with impurities, and the fourth active pattern. ACT4 may be formed of a semiconductor layer undoped with impurities. The fourth active pattern ACT4 corresponds to a portion of the semiconductor layer overlapping with the fourth gate electrode GE4. One end of the fourth source electrode SE4 is connected to the fourth active pattern ACT4, and the other end of the fourth source electrode SE4 is connected to the initialization power line IPL and a seventh drain electrode DE7 of the seventh thin film transistor T7. Since a second bridge pattern BR2 is provided between the fourth source electrode SE4 and the initialization power line IPL, one end of the second bridge pattern BR2 is connected to the fourth source electrode SE4 through a ninth contact hole CH9, and the other end of the second bridge pattern BR2 is connected to the initialization power line IPL through an eighth contact hole CH8. One end of the fourth drain electrode DE4 is connected to the fourth active pattern ACT4, and the other end of the fourth drain electrode DE4 is connected to the third drain electrode DE3 of the third thin film transistor T3. In addition, the fourth drain electrode DE4 is connected to the first gate electrode GE1 of the first thin film transistor T1 through the connection line CNL and the second and third contact holes CH2 and CH3.

The fifth thin film transistor T5 includes a fifth gate electrode GE5, a fifth active pattern ACT5, a fifth source electrode SE5, and the fifth drain electrode DE5.

The fifth gate electrode GE5 is connected to the light emitting control line EL. The fifth gate electrode GE5 is provided as a portion of the light emitting control line EL or provided in a shape protruding from the light emitting control line EL. In an exemplary embodiment of the present invention, the fifth active pattern ACT5, the fifth source electrode SE5, and the fifth drain electrode DE5 are formed of a semiconductor layer which may be undoped or doped with impurities. The fifth source electrode SE5 and the fifth drain electrode DE5 are formed of a semiconductor layer doped with impurities, and the fifth active pattern ACT5 is formed of a semiconductor undoped with impurities. The fifth active pattern ACT5 corresponds to a portion of the semiconductor layer overlapping with the fifth gate electrode GE5. One end of the fifth source electrode SE5 is connected to one end of the fifth active pattern ACT5, and the other end of the fifth source electrode SE5 is connected to the power line PL through a sixth contact hole CH6. One end of the fifth drain electrode DE5 is connected to the other end of the fifth active pattern ACT5, and the other end of the fifth drain electrode DE5 is connected to the first source electrode SE1 of the first thin film transistor T1 and the second drain electrode DE2 of the second thin film transistor T2.

The sixth thin film transistor T6 includes a sixth gate electrode GE6, a sixth active pattern ACT6, the sixth source electrode SE6, and a sixth drain electrode DE6.

The sixth gate electrode GE6 is connected to the light emitting control line EL. The sixth gate electrode GE6 is provided as a portion of the light emitting control line EL or provided in a shape protruding from the light emitting control line EL. In an exemplary embodiment of the present invention, the sixth active pattern ACT6, the sixth source electrode SE6, and the sixth drain electrode DE6 are formed of a semiconductor layer which may be doped or undoped with impurities. The sixth source electrode SE6 and the sixth drain electrode DE6 are formed of a semiconductor layer doped with impurities, and the sixth active pattern ACT6 is formed of a semiconductor layer undoped with impurities. The sixth active pattern ACT6 corresponds to a portion of the semiconductor layer overlapping with the sixth gate electrode GE6. One end of the sixth source electrode SE6 is connected to one end of the sixth active pattern ACT6, and the other end of the sixth source electrode SE6 is connected to the first drain electrode DE1 of the first thin film transistor T1 and the third source electrode SE3 of the third thin film transistor T3. One end of the sixth drain electrode DE6 is connected to the other end of the sixth active pattern ACT6, and the other end of the sixth drain electrode DE6 is connected to a seventh source electrode SE7 of a seventh thin film transistor T7 of a pixel on a previous row.

The seventh thin film transistor T7 includes a seventh gate electrode GE7, a seventh active pattern ACT7, the seventh source electrode SE7, and the seventh drain electrode DE7.

The seventh gate electrode GE7 is connected to the second scan line SL2. The seventh gate electrode GE7 is provided as a portion of the second scan line SL2 or provided in a shape protruding from the second scan line SL2. In an exemplary embodiment of the present invention, the seventh active pattern ACT7, the seventh source electrode SE7, and the seventh drain electrode DE7 are formed of a semiconductor layer which may be undoped or doped with impurities. The seventh source electrode SE7 and the seventh drain electrode DE7 are formed of a semiconductor layer doped with impurities, and the seventh active pattern ACT7 is formed of a semiconductor layer undoped with impurities. One end of the seventh active pattern ACT7 corresponds to a portion of the semiconductor layer overlapping with the seventh gate electrode GE7. One end of the seventh source electrode SE7 is connected to one end of the seventh active pattern ACT7, and the other end of the seventh source electrode SE7 is connected to a sixth drain electrode SE6 of a sixth thin film transistor T6 of a pixel on a next row. One end of the seventh drain electrode DE7 is connected to the other end of the seventh active pattern ACT7, and the other end of the seventh drain electrode DE7 is connected to the initialization power line IPL. The seventh drain electrode DE7 and the initialization power line IPL may be connected to each other through the second bridge pattern BR2 and the eighth and ninth contact holes CH8 and CH9.

The storage capacitor Cst includes a lower electrode LE and an upper electrode UE. The upper and lower electrodes UE and LE overlap each other, for example.

The lower electrode LE of the storage capacitor Cst may be a portion of the first gate electrode GE1 of the first thin film transistor T1. The upper electrode UE of the storage capacitor Cst may be a portion of the auxiliary power line APL. The auxiliary power line APL overlaps with the first gate electrode GE. From a plan view, the auxiliary power line APL covers a majority of the first gate electrode GE1. An area of the upper electrode UE that overlaps the lower electrode LE and an area of the lower electrode LE that overlaps the upper electrode UE are both increased, so that the capacitance of the storage capacitor Cst may be increased. In other words, the area of the storage capacitor Cst may be increased. In the auxiliary power line APL corresponding to the upper electrode UE, an opening OPN is provided in a region in which the second contact hole CH2, through which the first gate electrode GE1 and the connection line CNL are in contact with each other, is provided.

The light emitting device OLED includes an anode electrode AD, a cathode electrode CD, and an emitting layer EML provided between the anode electrode AD and the cathode electrode CD.

The anode electrode AD is provided in a pixel region corresponding to each pixel PXL. The anode electrode AD is connected to the seventh drain electrode DE7 of the seventh thin film transistor T7 and the sixth drain electrode DE6 of the sixth thin film transistor T6 through a fourth contact hole CH4 and a fifth contact hole CH5. A first bridge pattern BR1 is provided between the fourth contact hole CH4 and the fifth contact hole CH5 to connect the anode electrode AD to the sixth drain electrode DE6 and the seventh drain electrode DE7.

In addition, each pixel PXL may further include a blocking layer SDL disposed to correspond to the third thin film transistor T3.

The blocking layer SDL may include a first blocking layer SDL1 disposed to correspond to the 3ath thin film transistor T3a of the third thin film transistor T3 and a second blocking layer SDL2 disposed to correspond to the 3bth thin film transistor T3b of the third thin film transistor T3. The first blocking layer SDL1 and the second blocking layer SDL2 may be provided on the same layer.

From a plan view, the first blocking layer SDL1 may partially overlap with the 3ath drain electrode DE3a of the 3ath thin film transistor T3a. In addition, from a plan view, the first blocking layer SDL1 may partially overlap with a channel region of the 3ath active pattern ACT3a. In this case, a first drain-channel contact part DCC1 may be disposed between the channel region of the 3ath active pattern ACT3a and the 3ath drain electrode DE3a. The first drain-channel contact part DCC1 may be a region partially extending into the channel region of the 3ath active pattern ACT3a from a point at which the channel region of the 3ath active pattern ACT3a and the 3ath drain electrode DE3a are in contact with each other. In addition, the first drain-channel contact part DCC1 may be a portion of the 3ath active pattern ACT3a overlapping with the first blocking layer SDL1. The first drain-channel contact part DCC1 may have a width of about 3.5 μm or more.

When light is incident onto the back surface of the substrate SUB, e.g., the surface on which the 3ath active pattern ACT3a is not provided, the first blocking layer SDL1 may block the light from being incident onto the first drain-channel contact part DCC1.

From a plan view, the second blocking layer SDL2 may partially overlap with the 3bth drain electrode DE3b of the 3bth thin film transistor T3b. In addition, from a plan view, the second blocking layer SDL2 may partially overlap with a channel region of the 3bth active pattern ACT3b. In this case, a second drain-channel contact part DCC2 may be disposed between the channel region of the 3bth active pattern ACT3b and the 3bth drain electrode DE3b. The second drain-channel contact part DCC2 may be a region partially extending into the channel region of the 3bth active pattern ACT3b from a point at which the channel region of the 3bth active pattern ACT3b and the 3bth drain electrode DE3b are in contact with each other. In addition, the second drain-channel contact part DCC2 may be a portion of the 3bth active pattern ACT3b overlapping with the second blocking layer SDL2. The second drain-channel contact part DCC2 may have a width of about 3.5 μm or more.

When light is incident onto the back surface of the substrate SUB, the second blocking layer SDL2 can block the light from being incident onto the second drain-channel contact part DCC2.

The third thin film transistor T3 is connected to one end of the storage capacitor Cst, and hence, may have direct impact on a voltage stored in the storage capacitor Cst. Therefore, to prevent characteristics of the third thin film transistor T3 from being impacted by light incident from the back surface of the substrate SUB, the first and second blocking layers SDL1 and SDL2 may be provided below the third drain electrode DE3 (e.g., DE3b) of third thin film transistor T3 and a channel region of the third active pattern ACT3 (e.g., ACT3a). In addition, the first blocking layer SDL1 is partially overlapped by the third active pattern ACT3 (e.g., ACT3a), and the second blocking layer SDL2 is partially overlapped by the third drain electrode DE3 (e.g., DE3b).

In addition, a first dummy blocking layer may be provided between the 3ath source electrode SE3a and the channel region of the 3ath active pattern ACT3a. In addition, a second dummy blocking layer may be provided between the 3bth source electrode SE3b and a channel region of the 3bth active pattern ACT3b.

In an exemplary embodiment of the present invention, a case where the first and second blocking layers SDL1 and SDL2 are included in the third thin film transistor T3 has been described, but the present invention is not limited thereto. For example, the blocking layer SDL including the first and second blocking layers SDL1 and SDL2 may be provided in each of the first to seventh thin film transistors T1 to T7.

Again, a structure of the display device according to an exemplary embodiment of the present invention will be described along a stacking order with reference to FIGS. 8 to 11.

First, the first blocking layer SDL1 and the second blocking layer SDL2 are provided on the substrate SUB. The first blocking layer SDL1 and the second blocking layer SDL2 may be spaced apart from each other at a predetermined distance. For example, the first and second blocking layers SDL1 and SDL2 may include a metallic material.

A buffer layer BFL is provided over the first and second blocking layers SDL1 and SDL2 and on the substrate SUB. The buffer layer BFL may be made of an organic insulating material or inorganic insulating material.

A semiconductor pattern is provided on the buffer layer BFL. The semiconductor pattern includes the first to seventh source electrodes SE1 to SE7, the first to seventh drain electrodes DE1 to DE7, and the first to seventh active patterns ACT1 to ACT7 of the first to seventh thin film transistors T1 to T7, respectively.

The semiconductor pattern may be divided into first and second parts W1 and W2 having different widths from each other by depositing a semiconductor material on the front surface of the buffer layer BFL and then performing a chemical mechanical polishing (CMP) process. The first part W1 may be a region that does not overlap with the first and second blocking layers SDL1 and SDL2 and the second part W2 may be a region that overlaps with the first and second blocking layers SDL1 and SDL2. A thickness of the first part W1 may be greater than that of the second part W2.

The channel region of the 3ath active pattern ACT3$a$, which partially overlaps with the first blocking layer SDL1, may include the first and second parts W1 and W2. The channel region of the 3bth active pattern ACT3$b$, which partially overlaps with the second blocking layer SDL2, may include the first and second parts W1 and W2.

The 3ath drain electrode DE3$a$ overlapping with the first blocking layer SDL1 may be configured as the second part W2. The 3bth drain electrode DE3$b$ partially overlapping with the second blocking layer SDL2 may include all of the first and second parts W1 and W2.

The first drain-channel contact part DCC1 is disposed between the channel region of the 3ath active pattern ACT3$a$ and the 3ath drain electrode DE3$a$, and the second drain-channel contact part DCC2 is disposed between the channel region of the 3bth active pattern ACT3$b$ and the 3bth drain electrode DE3$b$. The second drain-channel contact part DCC2 may have the same width as the first drain-channel contact part DCC1, but the present invention is not limited thereto. For example, the second drain-channel contact part DCC2 may have a different width from that of the first drain-channel contact part DCC1.

A gate insulating layer GI is provided on the substrate SUB on which the semiconductor pattern is formed.

A gate pattern is provided on the gate insulating layer GI. The gate pattern includes the first scan line SL1, the second scan line SL2, the light emitting control line EL, and the first to seventh gate electrodes GE1 to GE7. The first gate electrode GE1 is configured to be the lower electrode LE of the storage capacitor Cst.

A first insulating layer IL1 is provided on the substrate SUB on which the gate pattern is formed. The first insulating layer IL1 may include any one insulating material selected from an inorganic insulating material including an inorganic material, and an organic insulating material including an organic material.

The auxiliary power line APL of the storage capacitor Cst and the initialization power line IPL are provided on the first insulating layer IL1. The auxiliary power line APL is the upper electrode UE of the storage capacitor Cst. In other words, the lower electrode LE and the upper electrode UE constitute the storage capacitor Cst with the first insulating layer IL1 interposed therebetween.

A second insulating layer IL2 is provided on the substrate SUB on which the auxiliary power line APL and the like are formed. The second insulating layer IL2 may be made of the same insulating material as the first insulating layer IL1, but the present invention is not limited thereto.

A data pattern is provided on the second insulating layer IL2. The data pattern includes the data line DL1, the power line PL, the connection line CNL, the first bridge pattern BR1, and the second bridge pattern BR2.

The data line DL1 is connected to the second source electrode DE2 through the seventh contact hole CH7 that sequentially passes through the second insulating layer IL2, the first insulating layer IL1, and the gate insulating layer GI.

The power line PL is connected to the auxiliary power line APL through the first contact hole CH1 passing through the second insulating layer IL2. In addition, the power line PL is connected to the fifth source electrode DE5 through the sixth contact hole CH6 sequentially passing through the second insulating layer IL2, the first insulating layer IL1, and the gate insulating layer GI.

The connection line CNL is connected to the first gate electrode GE1 through the second contact hole CH2 sequentially passing through the second insulating layer IL2 and the first insulating layer IL1. In addition, the connection line CNL is connected to the third drain electrode DE3 and the fourth drain electrode DE4 through the third contact hole CH3 sequentially passing through the second insulating layer IL2, the first insulating layer IL1, and the gate insulating layer GI.

The first bridge pattern BR1 is connected to the sixth drain electrode DE6 through the fourth contact hole CH4 sequentially passing through the second insulating layer IL2, the first insulating layer IL1, and the gate insulating layer GI. In addition, the first bridge pattern BR1 is connected to the anode electrode AD of the light emitting device OLED through the fifth contact hole CH5.

The second bridge pattern BR2 is connected to the initialization power line IPL through the eighth contact hole CH8 sequentially passing through the second insulating layer IL2 and the first insulating layer IL1. In addition, the second bridge pattern BR2 is connected to the fourth source electrode SE4 and the seventh drain electrode DE7 through the ninth contact hole CH9 sequentially passing through the second insulating layer IL2, the first insulating layer IL1, and the gate insulating layer GI.

A protective layer PSV is provided on the substrate SUB on which the data pattern is formed. For example, the protective layer PSV may be disposed on the second insulating layer IL2 on which the data pattern is provided. The anode electrode AD of the light emitting device OLED is provided on the protective layer PSV.

The anode electrode AD may be connected to the first bridge pattern BR1 through the fifth contact hole CH5 passing through the protective layer PSV. Since the bridge pattern BR1 is connected to the sixth drain electrode DE6 and the seventh source electrode SE7 through the fourth contact hole CH4, the anode electrode AD may be connected to the sixth drain electrode DE6 and the seventh source electrode SE7.

A pixel defining layer PDL that defines a pixel region to correspond to each pixel PXL may be provided on the substrate SUB on which the anode electrode AD is formed. The pixel defining layer PDL includes an opening that exposes a top surface of the anode electrode AD, and may protrude from the substrate SUB along the border of the pixel PXL.

The emitting layer EML may be provide in the pixel region surrounded by the pixel defining layer PDL (e.g., the opening), and the cathode electrode CD may be provided on the emitting layer EML.

An encapsulation layer SLM that covers the cathode electrode CD may be provided over the cathode electrode CD.

As described above, in each pixel PXL of the display device according to an exemplary embodiment of the present invention, the first and second blocking layers SDL1 and SDL2 are provided below the third drain electrode DE3 of the third thin film transistor T3 and the channel region of the third active pattern ACT3, so that characteristics of the third thin film transistor T3 may not be impacted by light incident onto the back surface of the substrate SUB. Accordingly, a high-resolution display device may be implemented.

In the display device according to a exemplary embodiment of the present invention, the blocking layer SDL provided to block light incident onto the back surface of the substrate SUB may have various shapes.

The display device according to an exemplary embodiment of the present invention may be employed in various electronic devices. For example, the display device is applicable to televisions, notebook computers, cellular phones, smart phones, smart pads, tablet computers, portable media players (PMPs), personal digital assistants (PDAs), navigation devices, various wearable devices such as smart watches, and the like.

According to the present invention, a thin film transistor capable of minimizing a leakage current may be provided.

Further, according to the present invention, a method of manufacturing the thin film transistor is provided.

Further, according to the present invention, a display device having the thin film transistor is provided.

While the present invention has been described with reference to exemplary embodiments thereof, it will be understood by those of ordinary skill in the art that various changes in form and details may be made thereto without departing from the spirit and scope of the present invention as defined by the following claims.

What is claimed is:

1. A display device comprising:
a display element; and
a thin film transistor connected to the display element,
wherein the thin film transistor includes:
a first blocking layer disposed on a substrate;
an active pattern disposed on the first blocking layer,
  wherein the active pattern includes a source region, a drain region, and a channel region disposed between the source region and the drain region;
a gate electrode disposed on the active pattern, wherein the channel region corresponds to a portion of the active pattern overlapping by the gate electrode; and
a source electrode connected to the source region, and a drain electrode connected to the drain region,
wherein the active pattern includes a first part and a second part, wherein the first part partially overlaps with the first blocking layer, and the first part and the second part have different thicknesses from each other,
wherein a first portion of the channel region overlapping a first portion of the gate electrode does not overlap the first blocking layer.

2. The display device of claim 1, wherein the second part of the active pattern does not overlap with the first blocking layer.

3. The display device of claim 2, wherein a thickness of the first part of the active pattern is less than a thickness of the second part of the active pattern.

4. The display device of claim 1, wherein the drain region partially overlaps with the first blocking layer.

5. The display device of claim 4, wherein the active pattern further comprises a drain-channel contact part disposed between the drain region and the channel region,
wherein the drain-channel contact part overlaps with the first blocking layer.

6. The display device of claim 1, further comprising a second blocking layer partially overlapping with the drain region and the channel region, and
wherein the first blocking layer partially overlaps with the source region and the channel region.

7. The display device of claim 6, wherein the first blocking layer and the second blocking layer are disposed in the same layer.

8. The display device of claim 6, wherein the active pattern further comprises a source-channel contact part disposed between the source region and the channel region, and a drain-channel contact part disposed between the drain region and the channel region,
wherein the source-channel contact part overlaps with the first blocking layer, and the drain-channel contact part overlaps with the second blocking layer.

9. The display device of claim 1, wherein the display element includes:
a first electrode connected to the drain electrode of the thin film transistor;
an emitting layer disposed on the first electrode; and
a second electrode disposed on the emitting layer.

10. The display device of claim 1, wherein a thickness of, the first pan of the active pattern extending from a first edge of the first blocking layer to a second edge of the first blocking layer is constant and less than a thickness of the second part of the active pattern.

11. A display device comprising:
a display element; and
a thin film transistor connected to the display element,
wherein the thin film transistor includes:
a first blocking layer disposed on a substrate;
an active pattern disposed on the first blocking layer,
  wherein the active pattern includes a source region, a drain region, and a channel region disposed between the source region and the drain region;
a gate electrode disposed on the active pattern, wherein the channel region corresponds to a portion of the active pattern overlapping by the gate electrode; and
a source electrode connected to the source region, and a drain electrode connected to the drain region,
wherein the active pattern includes a first part and a second part, wherein the first part partially overlaps with the first blocking layer, and the first part and the second part have different thicknesses from each other,
wherein the drain region partially overlaps with the first blocking layer, wherein the active pattern further comprises a drain-channel contact part disposed between the drain region and the channel region,
wherein the drain-channel contact part overlaps with the first blocking layer, wherein the drain-channel contact part is covered by the first blocking layer to block light that is incident onto a surface of the substrate, on which the active pattern is not disposed.

12. The display device of claim 11, wherein the drain-channel contact part partially extends into the channel region from a point at which the channel region and the drain region are in contact with each other.

13. The display device of claim 12, wherein the drain-channel contact part has a width of about 3.5 μm or more.

14. A display device comprising:
a display element; and
a thin film transistor connected to the display element, wherein the thin film transistor includes:
a first blocking layer disposed on a substrate;
an active pattern disposed on the first blocking layer, wherein the active pattern includes a source region, a drain region, and a channel region disposed between the source region and the drain region;
a gate electrode disposed on the active pattern, wherein the channel region corresponds to a portion of the active pattern overlapping by the gate electrode;
a source electrode connected to the source region, and a drain electrode connected to the drain region, wherein the active pattern includes a first part and second part, wherein the first part partially overlaps with the first blocking layer, and the first part and the second part have different thicknesses from each other; and
a second blocking layer partially overlapping with the drain region and the channel region,
wherein the first blocking layer partially overlaps with the source region and the channel region,
wherein the active pattern further comprises a source-channel contact part disposed between the source region and the channel region, and a drain-channel contact part disposed between the drain region and the channel region,
wherein the source-channel contact part overlaps with the first blocking layer, and the drain-channel contact part overlaps with the second blocking layer, wherein the source-channel contact part is covered by the first blocking layer to block light that is incident onto a surface of the substrate, on which the active pattern is not disposed, and
wherein the drain-channel contact part is covered by the second blocking layer to block light that is incident onto the surface of the substrate, on which the active pattern is not disposed.

15. The display device of claim 14, wherein the source-channel contact part partially extends into the channel region from a point at which the channel region and the source region are in contact with each other, and
wherein the drain-channel contact part partially extends into the channel region from a point which the channel region and the drain region are in contact with each other.

16. The display device of claim 15, wherein each of the source-channel contact part and the drain-channel contact part has a width of about 3.5 μm or more.

* * * * *

UNITED STATES PATENT AND TRADEMARK OFFICE
CERTIFICATE OF CORRECTION

| | | |
|---|---|---|
| PATENT NO. | : 10,804,299 B2 | Page 1 of 1 |
| APPLICATION NO. | : 16/275829 | |
| DATED | : October 13, 2020 | |
| INVENTOR(S) | : Jun Hee Lee, In Jun Bae and Deok Hoi Kim | |

It is certified that error appears in the above-identified patent and that said Letters Patent is hereby corrected as shown below:

On the Title Page

Item [72] change "Jun Hee Lee, Yongin-si (KR); In Jun Bae, Yongin-si (KR)" to --Jun Hee Lee, Yongin-si (KR); In Jun Bae, Yongin-si (KR); Deok Hoi Kim, Yongin-si (KR)--.

Signed and Sealed this
Twenty-ninth Day of August, 2023

Katherine Kelly Vidal
*Director of the United States Patent and Trademark Office*